United States Patent [19]

Lur

[11] Patent Number: 5,472,902
[45] Date of Patent: Dec. 5, 1995

[54] SILICON-ON-INSULATOR ISOLATION TECHNOLOGY USING LIQUID PHASE DEPOSITION

[75] Inventor: Water Lur, Taipei, Taiwan

[73] Assignee: United Microelectronics Corp., Hsinchu, Taiwan

[21] Appl. No.: 215,175

[22] Filed: Mar. 21, 1994

[51] Int. Cl.⁶ ................................................. H01L 21/76
[52] U.S. Cl. ............................ 437/62; 437/245; 437/67
[58] Field of Search ............................ 437/67, 245, 62; 148/DIG. 50, DIG. 85, DIG. 86, DIG. 118

[56] References Cited

U.S. PATENT DOCUMENTS

| | | | |
|---|---|---|---|
| 4,916,086 | 4/1990 | Takahashi et al. | |
| 5,256,593 | 10/1993 | Iwai | 437/67 |
| 5,336,634 | 8/1994 | Katayama et al. | |

FOREIGN PATENT DOCUMENTS

| | | |
|---|---|---|
| 63-0142831 | 6/1988 | Japan . |
| 4132240 | 5/1992 | Japan . |

OTHER PUBLICATIONS

Lan, H., "Silicon–On–Insulator by Oxygen Ion Implantation", *J. Crystal Growth*, 63 (1983) pp. 554–558.

Primary Examiner—George Fourson
Attorney, Agent, or Firm—Ladas & Parry

[57] ABSTRACT

A method of forming an isolated structure on a silicon substrate having a silicon-on-insulator (SOI) structure using liquid phase deposition which is capable of selectively depositing oxide only in trenches of the substrate. Recessed field oxides are grown with the same height and leave a flat surface on a top surface of the substrate. The liquid phase deposition is performed using saturated hydrofluosilicic acid as a reactant.

8 Claims, 5 Drawing Sheets

5,472,902

SILICON-ON-INSULATOR ISOLATION TECHNOLOGY USING LIQUID PHASE DEPOSITION

FIELD OF THE INVENTION

The present invention relates to a method of forming an isolation structure for an integrated circuit (IC) device, especially to a method of forming an isolation structure of an integrated circuit using selective liquid-phase-deposition (LPD) in a silicon-on-insulator (SOI) structure.

BACKGROUND OF THE INVENTION

With the continual improvement of semiconductor chip fabrication techniques, the number of devices which can be packed onto a semiconductor chip has increased greatly, while the size of the individual devices have decreased markedly. Today several million devices can be fabricated in a single—chip consider, for example, the mega-bit memory chips which are commonly used today in personal computers and in other applications. In such high-density chips, elements must be insulated properly in order to obtain good performance. The main purpose of element insulation techniques is to provide good insulation between the elements of the devices using smaller insulation area, to provide more space for more devices and their elements.

In the past, the so-called LOCal Oxidation of Silicon (LOCOS) technique has been widely used in the art of insulation of integrated circuit chips. According to this method, a thick oxide is grown as an insulating layer, to insulate the elements. FIGS. 1A to 1D demonstrate the prior art LOCOS technique. At first, a pad oxide layer 11 and then a silicon nitride layer 12 are formed on a silicon substrate 10. Those layers are patterned using lithography and etching techniques, yielding the structure shown in FIG. 1A. After that, impurities of a type to form channel-stop are implanted in the uncovered portion of the substrate 10, to form a channel stop implantation layer 13, as shown in FIG. 1B.

Referring to FIG. 1C, a thick field oxide 14 is formed by thermal oxidation. Since the oxidizing speed of silicon nitride is less than that of silicon, the silicon nitride layer 12 works like a mask against thermal oxidation, so the field oxide grows only where the substrate 10 is not covered by the silicon nitride layer 12. Finally, silicon nitride layer 12 is removed to obtain the isolation structure shown in FIG. 1D.

The above described conventional LOCOS technique has a number of disadvantages, which become rather unacceptable when attempting to apply this technique to the fabrication of sub-micron devices. First, the oxidization of silicon does not happen only in the vertical direction but also in the horizontal direction. As a result, a part of the field oxide grows under the adjacent silicon nitride layer 12 and lifts it up, as can be seen in FIG. 1C. This is termed the "bird's beak effect" by persons skilled in the art. Secondly, due to the stresses caused by the bird's beak effect, a part of nitride in the compressed regions of silicon nitride layer 12 diffuses to adjacent tensile strained regions at the interface of the pad oxide layer 11 and the substrate 10, and forms a silicon-nitride-like region 15. In later processing to form gate oxides, the gate oxides will be thinned due to the mask effect of the silicon-nitride-like layer 15. It is termed "white ribbon effect" because a white ribbon will appear at the edges of active regions under optical microscopes.

Additionally, because the volume of silicon dioxide is 2.2 times as large as that of silicon, the field oxide 14 protrudes from the surface of the silicon substrate 10, forming a non-recessed surface. Furthermore, the channel stop implantation layer 13 will diffuse laterally during the high temperature oxidation of the silicon used in forming the field oxide 14, which reduces the width of adjacent active regions. Decreasing the width of those active regions is a disadvantage when one is trying to scale down the dimensions of the device. Additionally, due to the lateral expansion of the field oxide 14 during oxidation, there is a lot of stress which occurs in the active region. Many crystalline defects are produced near the bird's beak regions, and result in an increase of junction leakage and a reduction of the reliability of the devices.

Many modified processes have been promoted to overcome the above-discussed disadvantages of LOCOS, such as: adding a spacer to reduce the bird's beak effect, adding a sacrificial oxide layer to solve the white-ribbon effect, or forming a trench before depositing field oxide layer to obtain a flat surface. Each of these suggestions solves some of the disadvantages of LOCOS, but they also increase the complexity of entire processes and, at the same time, and reduce production efficiency.

Trench isolation is another technique which has been utilized in an attempt to overcome the disadvantages of LOCOS. In this technique, which is now described with reference to FIG. 2, trenches 18 and 19 are etched on the silicon substrate 10 and then a field oxide layer 14 is deposited to fill the trenches, so as to form a recessed isolation layer. This technique uses chemical vapor deposition (CVD) to form the field oxide layer. The field oxide layer is deposited on the entire surface of the substrate, including in the trenches 18 and 19, and therefore further processing is needed to remove oxide from active regions. Furthermore, the field oxide does not only grow vertically from the bottom of the trenches, but also laterally from the sidewalls of the trenches, as can be seen in FIG. 2. Since a typical semiconductor chip would have numerous trenches of varying widths, when the comparatively narrow trenches have been filled up, the comparatively wide trenches have not been fully filled. If the deposition process is extended to fill the wide trenches, the field oxide formed in the narrow trenches will be too thick, causing a non-recessed surface to occur which, in turn, presents certain disadvantages during later processing, as is well known by those skilled in the art.

In building more and more compact integrated circuits, a Silicon-On-Insulator (SOI) technique is frequently used. Its structure mainly comprises a single-crystal silicon layer deposited on an insulator, usually thinner than 1 μm. An insulated trench is formed which extends to the insulator, thereby forming insulated silicon islands on the insulator, where devices can be formed thereon with excellent insulation from devices on neighboring islands. Such an isolated structure is suitable for use in high speed, low power consumption, or high voltage applications. Furthermore, this structure is practicable for three-dimensional integrated circuits, to solve limitations associated with two-dimensional integrated circuits.

SUMMARY OF THE INVENTION

The object of the present invention is to provide a method of forming an isolation structure on an integrated circuit having an SOI structure, in which field oxide is selectively grown in the trenches, and vertically grown from the bottom of the trenches, without lateral deposition, therefore forming field oxides of same height in every trench.

The above objects are fulfilled by providing a method of forming a field oxide on a silicon substrate. The method comprises the following steps: (a) forming a buried oxide layer in said silicon substrate; (b) forming at least one trench to reach the buried oxide layer on said silicon substrate; and (c) depositing a field oxide to fill the trench using liquid phase deposition.

BRIEF DESCRIPTION OF THE DRAWING

The present invention will become more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

Figure 1A:
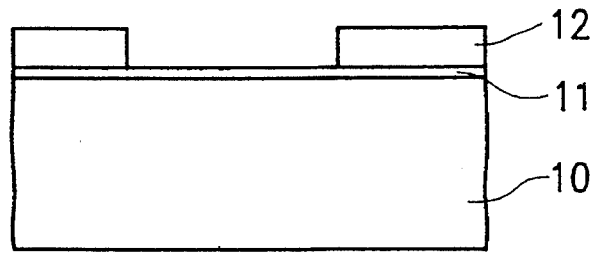
FIGS. 1A to 1D are cross-sectional views show the processes of conventional LOCOS technique.
Figure 1B:
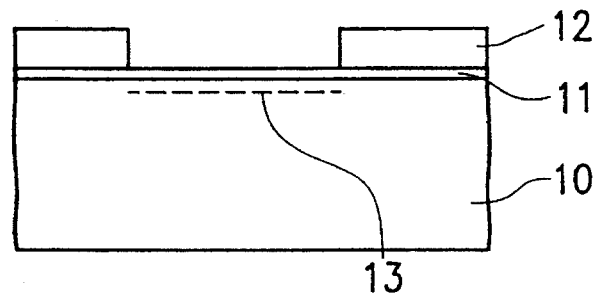
Figure 1C:
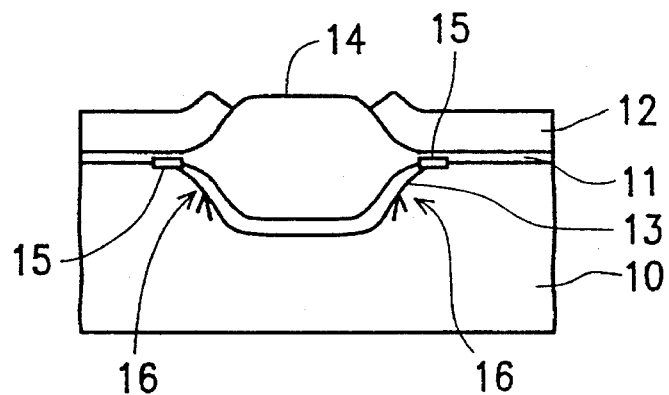
Figure 1D:
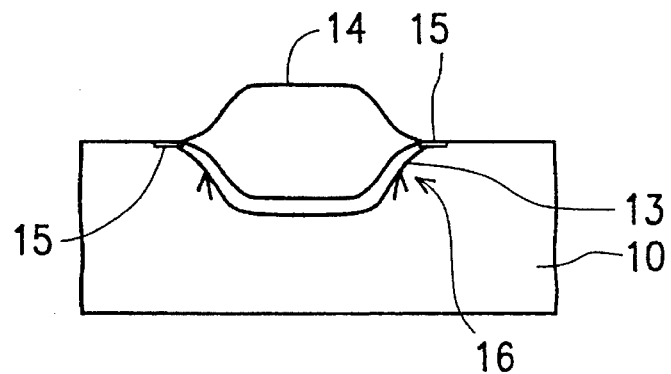
Figure 2:
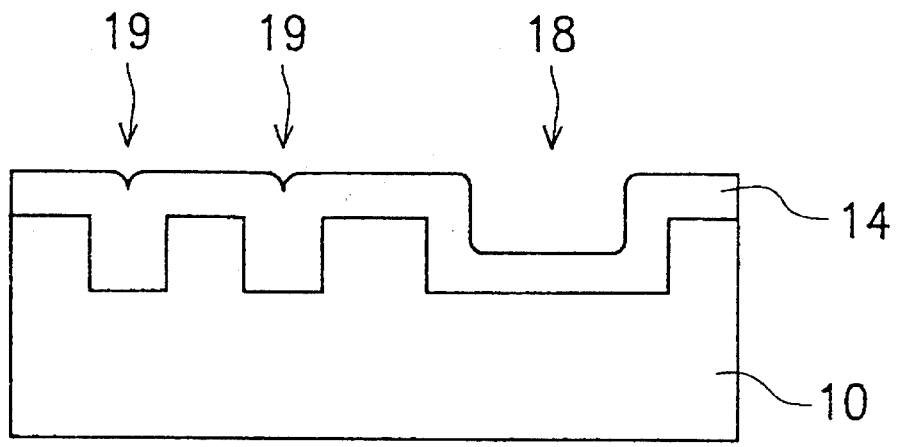
FIG. 2 is a cross-sectional view shows the structure of conventional trench isolation structure.
Figure 3:
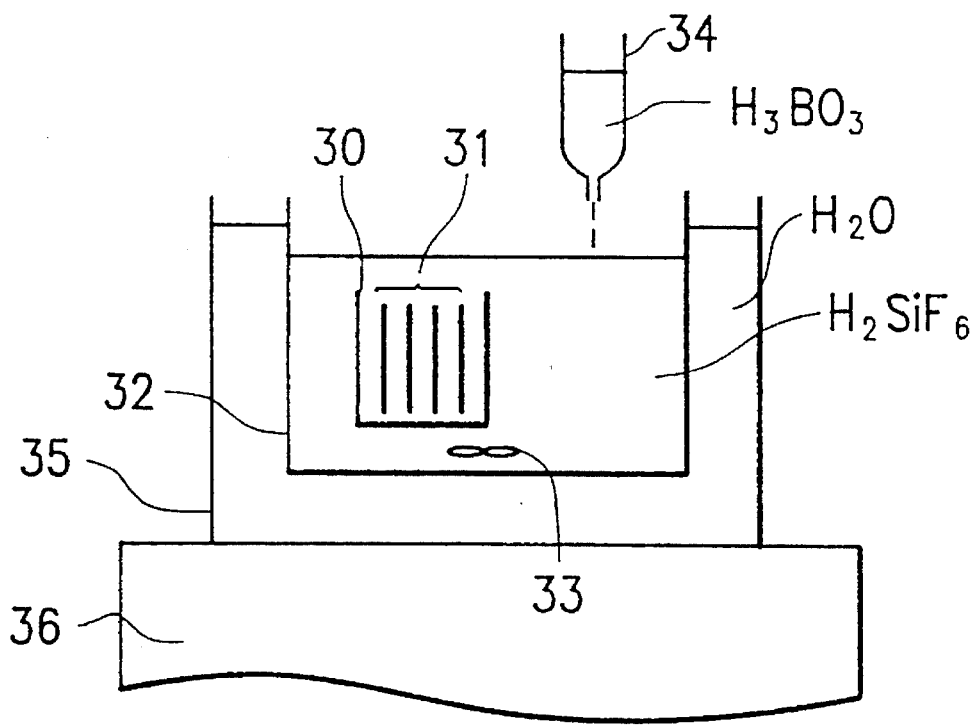
FIG. 3 shows a liquid phase deposition (LPD) device used in the method according to the present invention.
Figure 4A:
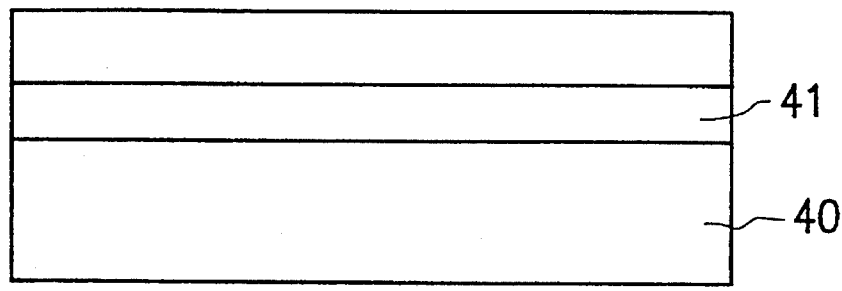
FIGS. 4A to 4C are cross-sectional views show a preferred embodiment of the method according to the present invention.
Figure 4B:
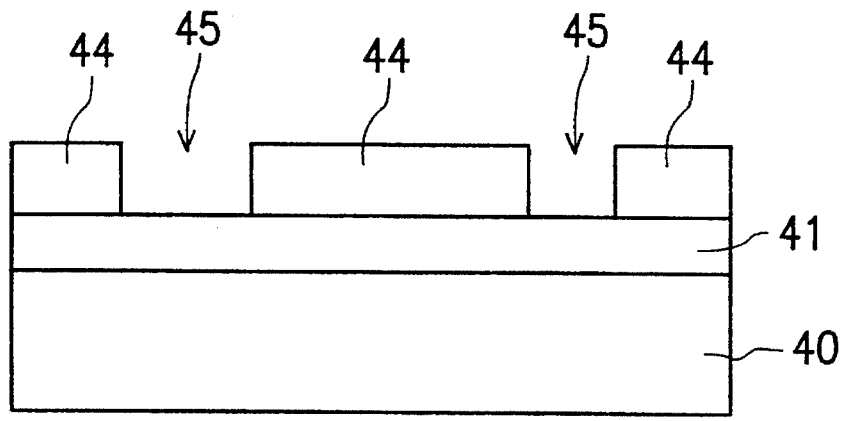
Figure 4C:
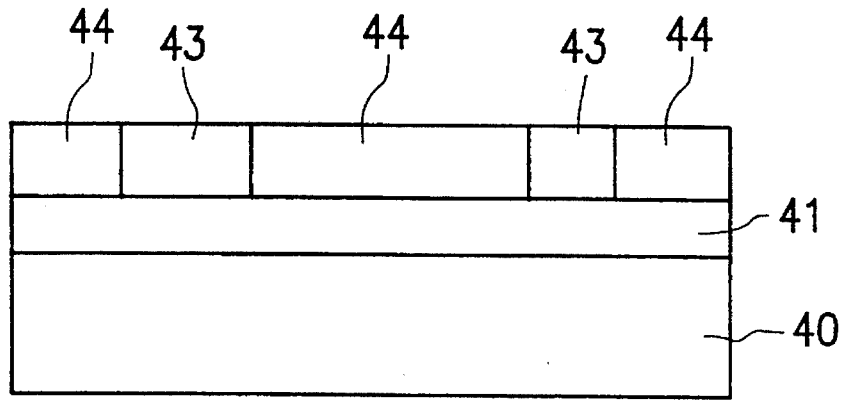

A preferred embodiment according to the present invention shown in FIGS. 4A to 4C is discussed below. An apparatus for performing liquid-phase deposition is discussed with reference to FIG. 3.

A buried insulating layer 41 is formed in a silicon substrate 40 by, for example, implanting oxygen ions into the substrate 40 at 50 to 200 KeV with a dosage between $1\times10^{18}$ to $3\times10^{18}$ atoms/cm$^2$, then annealing the substrate 40 at 1100° C. to 1300° C. for 1 to 5 hours, to form a layer 41 of silicon dioxide and to obtain an SOI structure as shown in FIG. 4A.

Trenches 45 are etched to a depth which reaches the oxide layer 41 to define active regions 44 as shown in FIG. 4B. This can be done by conventional lithography and etching techniques. For example, a photoresist layer can be coated and patterned on the substrate 40. Trenches 45 can be formed by Reactive Ion Etching (RIE). Then the photoresist layer can be removed by wet etching now or after the field oxide 43 is deposited, as will now be described. The trenches may cross the surface of the substrate 40 in two directions in order to define isolated islands of silicon 44.

Referring to FIG. 4C, the substrate 40 is placed in a liquid phase deposition device as shown in FIG. 3, to deposit a field oxide 43 to fill the trenches 45. The liquid phase deposition device includes a reactor 32 containing hydrofluosilicic acid ($H_2SiF_6$) as a reactant, a carrier 30 Placed in the reactor 32 for holding silicon wafers 31, a stirrer 33 for stirring the reactant, a injector 34 to add boric acid ($H_3BO_3$) into the reactor 32 to keep the hydrofluosilicic acid saturated, a water bath 35, and a temperature controlled heater 36, which maintains the temperature of the water bath 35 between 33° C. and 37° C. The hydrofluosilicic acid ($H_2SiF_6$) is saturated with $SiO_2$ powder. Liquid Phase Deposition of $SiO_2$ is described in the article entitled "A Selective $SiO_2$ Film-Formation Technology Using Liquid-Phase Deposition for Fully Planarized Multilevel Interconnections," J. Electrochem. Soc., Vol., 140, No. 8, August 1993, the disclosure of which is hereby incorporated herein by reference.

Since LPD has a relatively high deposition selectivity, field oxide will only deposit on silicon dioxide or polysilicon, not on other materials such as silicon, tungsten, or photoresist. In the present embodiment, since the surface of the silicon substrate 40 and the side walls of the trenches 45 are silicon (and if the photoresist is still in place then the surface of the substrate 40 is covered by photoresist, to which the deposited silicon dioxide will not adhere), the field oxide 43 will only vertically deposit on the bottom of the trenches 45, without lateral deposition. Therefore, no matter how wide the trenches are, flat field oxides 43 with same height will grow in every trench. Thus the field oxides grow anisotropically in trenches 45 and the height of the deposited $SiO_2$ can be easily controlled by controlling the deposition time.

Another preferred embodiment according to the present invention shown in FIGS. 5A to 5E is discussed below.

Figure 5A:
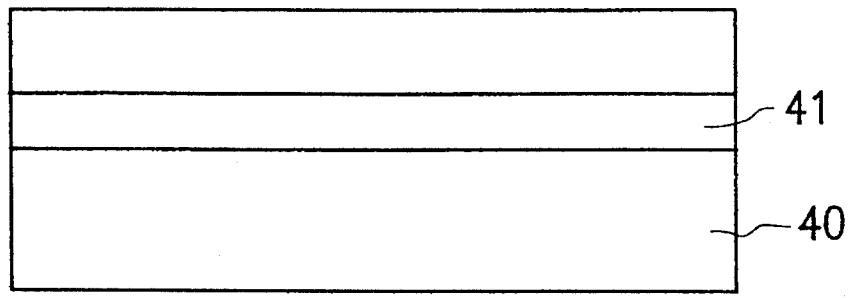
FIGS. 5A to 5E are cross-sectional views show another preferred embodiment of the method according to the present invention.

A buried insulating layer 41 is formed in a silicon substrate 40 by, for example, implanting oxygen ions into the substrate 40 at 50 to 200 KeV with a dosage between $1\times10^{18}$ to $3\times10^{18}$ atoms/cm$^2$, then annealing the substrate 40 at 1100° C. to 1300° C. for 1 to 5 hours, to form a layer 41 of silicon dioxide and to obtain an SOI structure as shown in FIG. 5A.

Figure 5B:
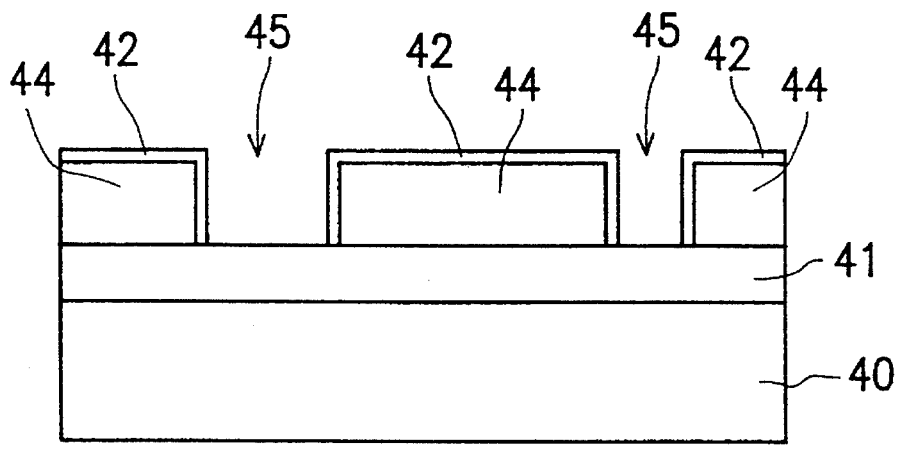

Referring now to FIG. 5B, trenches 45 are etched to a depth which reaches the oxide layer 41 by conventional lithography and etching techniques. The trenches preferably cross the substrate 40 in two directions to define isolated active regions or islands 44. A tungsten layer 42, having a thickness between 500 Å and 2000 N, is formed by chemical vapor deposition (CVD) or physical vapor deposition (PVD). The tungsten layer 42 cover the surface of the active regions or islands 44, and the sidewalls and the bottom of the trenches 45. Anisotropic etching, such as RIE, is then used, after suitably masking the island regions 44 and sidewalls, to remove the tungsten layer at the bottom of the trenches 45 leaving a tungsten spacer layer 42 on the sidewalls of the trenches 45.

Figure 5C:
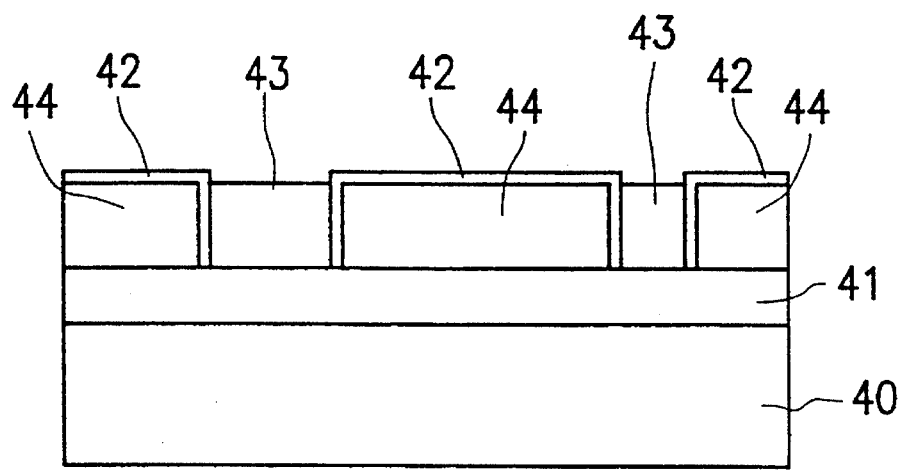

Referring to FIG. 5C, the substrate 40 is placed in the liquid phase deposition device shown in FIG. 3, to deposit field oxides 43 which fill the trenches 45, in the same manner as previously described. Since LPD has a relatively high deposition selectivity, field oxides will only deposit on silicon dioxide or polysilicon, not on other materials such as silicon, tungsten, or photoresist. In the present embodiment, the field oxides 43 will only vertically deposit on the bottom of the trenches 45, without lateral deposition. Therefore, no matter how wide the trenches are, flat field oxides 43 with same height will grow in every trench.

Figure 5D:
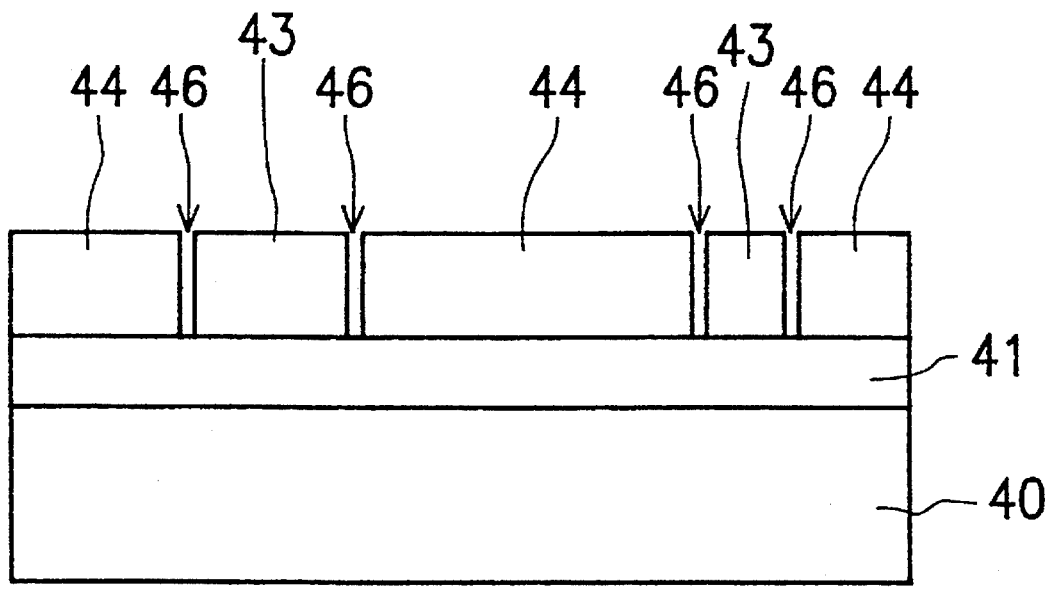

As is shown in FIG. 5D, the tungsten spacer layer 42 is etched away by sulfuric acid or nitric acid, leaving gaps 46 between the active regions 44 and the field oxides 43.

Figure 5E:
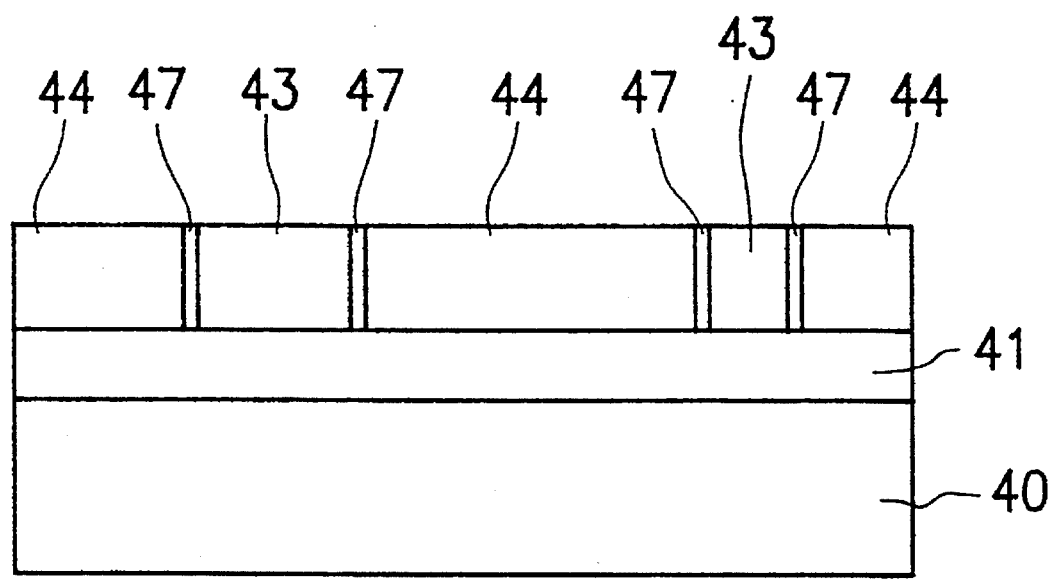

The substrate is preferably heated at 800° C. to 1000° C. in an oxygen free environment for 30 to 60 minutes, to densify the field oxides 43. A dielectric layer 47, such as silicon dioxide or silicon nitride, can be deposited to fill, at least partially, the gaps 46 using conventional deposition techniques such as CVD. The resulting structure is shown in FIG. 5E. It has a plurality of isolated islands 44 and a planar surface. The gaps 43 are difficult to completely fill due to their small size. However, even if they are not filled, the unfilled voids left behind still have excellent dielectric properties, such as stress relaxation and reduction of parasitic capacitance.

Those skilled in the art will appreciate that the first embodiment has the advantage of fewer steps compared to the second embodiment. However, the first embodiment needs to have the steps performed in a limited amount of time to prevent oxidation of the silicon substrate. More steps are required for the second embodiment, but those skilled in the art will appreciate that it has the advantage of a wide processing time limitation.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming an isolated structure on a silicon substrate, comprising the following steps:
   (a) forming a buried insulating layer in said silicon substrate;
   (b) forming at least one trench having a bottom surface therein which at least meets the buried insulating layer in said silicon substrate;
   (c) forming a tungsten layer covering said silicon substrate except the bottom surface of said at least one trench;
   (d) subsequently depositing a field oxide to fill the resulting trench using liquid phase deposition;
   (e) removing the tungsten layer and thereby leaving at least one gap along a sidewall of said at least one trench; and
   (f) depositing a dielectric layer to fill said at least one gap.

2. The method of claim 1, wherein said insulating layer is a layer of silicon oxide.

3. The method of claim 2, wherein step (a) comprises implanting oxygen ions into said silicon substrate at 50 to 200 KeV with a dosage between $1\times10^{18}$ to $3\times10^{18}$ atoms/cm$^2$ and annealing said silicon substrate at 1100° C. for 1 to 5 hours.

4. The method of claim 1, wherein the tungsten layer in step (c) has a thickness between 500 Å and 2000 Å.

5. The method of claim 1, wherein the step (d) is performed at a temperature between 33° C. to 37° C. using saturated hydrofluosilicic acid as a reactant.

6. The method of claim 1, wherein the step (f) comprises heating the resulting silicon substrate at 800° C. to 1000° C. in an essentially oxygen-free environment for 30 to 60 minutes.

7. The method of claim 1, wherein the dielectric layer is silicon dioxide.

8. The method of claim 1, wherein the dielectric layer is silicon nitride.

* * * * *